United States Patent [19]

Oliver

[11] Patent Number: 4,736,351

[45] Date of Patent: Apr. 5, 1988

[54] PRECISION SEMICONDUCTOR DEVICE TIMER

[76] Inventor: Douglas E. Oliver, 25 Northwoods La., La Crescenta, Calif. 91214

[21] Appl. No.: 9,113

[22] Filed: Jan. 28, 1987

Related U.S. Application Data

[63] Continuation of Ser. No. 902,008, Aug. 28, 1986, abandoned, which is a continuation of Ser. No. 664,478, Oct. 24, 1984, abandoned.

[51] Int. Cl.[4] .......................... G04F 8/00; G01R 25/00
[52] U.S. Cl. .................................... 368/118; 368/120; 324/83 R; 371/20
[58] Field of Search ................................ 368/113–121, 368/107–112; 364/569, 579; 307/269; 377/20; 324/73 AT, 82, 83 R, 83 FE; 371/20, 21, 24

[56] References Cited

U.S. PATENT DOCUMENTS

| | | | |
|---|---|---|---|
| 2,621,238 | 12/1952 | Palmer | 368/115 |
| 3,334,305 | 8/1967 | Yen | 324/83 FE |
| 3,449,671 | 6/1969 | Long | 324/88 |
| 3,659,087 | 4/1972 | Green et al. | 364/486 |
| 3,694,643 | 9/1972 | Smith | 364/553 |
| 3,958,269 | 5/1976 | Davis | 324/88 |
| 3,968,427 | 7/1976 | Sharrit | 324/83 R |
| 4,161,029 | 7/1979 | Frye | 364/579 |
| 4,164,648 | 8/1979 | Chu | 368/118 |
| 4,165,459 | 8/1979 | Curjice | 364/569 X |
| 4,263,545 | 4/1981 | Satake et al. | 368/107 X |
| 4,280,220 | 7/1981 | Vaeches | 371/27 |
| 4,332,028 | 5/1982 | Joecotten | 371/21 |
| 4,348,743 | 9/1982 | Dozier | 368/107 X |
| 4,451,782 | 5/1984 | Ashida | 324/83 R |
| 4,468,746 | 8/1984 | Davis | 364/569 |

Primary Examiner—Vit W. Miska
Attorney, Agent, or Firm—Lyon & Lyon

[57] ABSTRACT

A microprocessor controls a programmable oscillator, directing it to produce digital pulses of variable width and frequency. The microprocessor generates inputs for the device under test and compares its outputs after one clock cycle with expected outputs. The clock cycle is adjusted repeatedly until the device's time to complete is known. Response times for the system both with and without the device under test are measured and the difference reported.

13 Claims, 1 Drawing Sheet

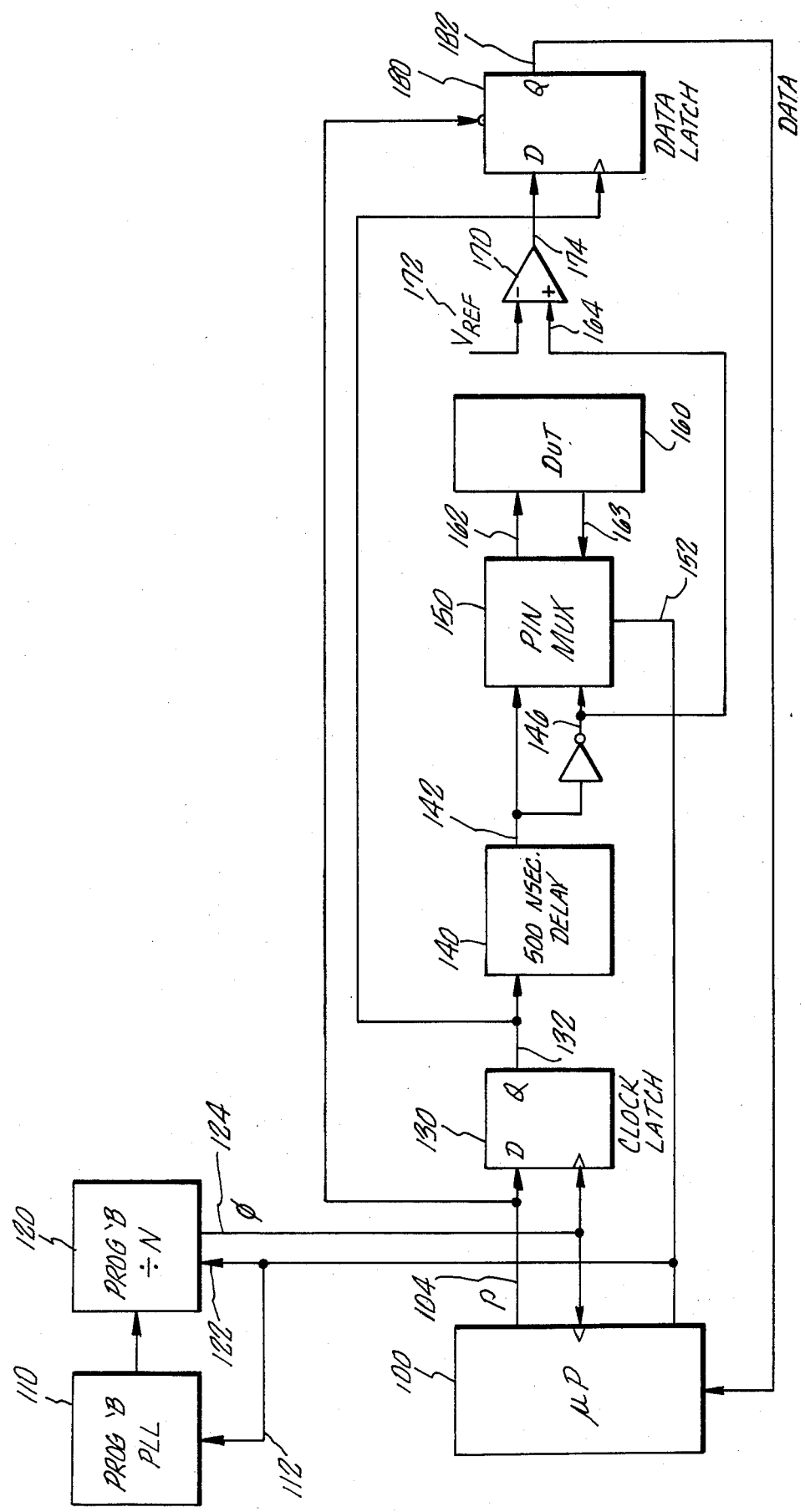

PRECISION SEMICONDUCTOR DEVICE TIMER

This application is a continuation of application Ser. No. 902,008, filed Aug. 28, 1986, now abandoned, which is a continuation of application Ser. No. 664,478, filed 10/24/84, now abandoned.

FIELD OF THE INVENTION

The present invention relates to the precision measurement of semiconductor device response times. More specifically, it relates to the use of a microprocessor controlled variable pulse generator to measure the delay introduced by the device under test.

BACKGROUND OF THE INVENTION

Semiconductor devices are common elements in present electrical and computing circuitry. They are designed to be very small and very fast, and usually succeed at both. Since an entire system's speed or throughput is often directly related to the speed of its components, most semiconductor devices are graded by their manufacturers by response time. Because the faster devices also demand a premium price, any device's true propagation delays are of concern to both the design engineer and the production quality control department.

The Prior Art

One presently employed method of timing is to compare the operation of the device under test ("DUT") to the propagation of a signal across a known delay line, usually an inductive coil delay. The delay line must be precisely calibrated, and provides only limited system accuracy for measurements in the sub-nanosecond range.

While this method of the prior art accomplishes its objective, to measure the response time of a semiconductor device, it has some drawbacks. Delay-line circuits are difficult to make accurate, and when made accurate, are expensive. It is somewhat difficult to make accurate delay-lines with less than about 1 nsec (nanosecond) delay.

Another presently employed method of timing is to display the signal from the DUT on a fast-writing oscilliscope. The operator reads the time measurement and reports on the delay introduced by the DUT.

While this method of the prior art accomplishes its objective, it also has some drawbacks. Reliance on a human operator adds to expense and sharply reduces reliability. Timing accuracy and precision, when read from an oscilliscope screen, are often no better than a 10% error ratio. Also, this method only works well for timing a periodic signal.

Objectives

Therefore, it is an object of the present invention to improve the precision with which device response time can be measured, by use of a process which can discern very fine time delays, i.e., more fine than 1 nsec.

It is a second object of the present invention to improve the accuracy and reliability of device response time measurements, by greatly reducing the potential for human error or timer component inaccuracies.

It is yet a third object of the present invention to reduce the cost of device response time measurements, by reducing the number and cost of required precision components.

These and other objects of the present invention will be more clearly understood from an examination of the specification, the drawings, and the accompanying claims.

SUMMARY OF THE INVENTION

A programmable microprocessor is used to set the frequency (and consequently, the pulse-width) of a programmable oscillator, which generates a raw digital clock signal. This clock signal is returned to the microprocessor and serves as the microprocessor system clock.

The microprocessor generates a multi-bit stimulus word which is used as an input to the DUT. The stimulus word is applied to the DUT's input pins and enabled after a fixed (for example, 500 nsec) delay. The stimulus word is then input to the DUT, and the output response of the DUT is fed to a comparator circuit.

At the end of one cycle, the comparator circuit compares the actual output of the DUT with an expected output value (a data word generated by the microprocessor). If the outputs match, the DUT has successfully completed its operation, and the timer cycle is decreased by the microprocessor. This process is repeated until, for some timer cycle, the DUT has not yet completed its operation within the "window" allotted.

To initialize the system, this timing test is performed with the stimulus word signals connected directly to the comparator circuit. The time delay measured in this loop is the system's own delay; this system delay is subtracted from the delay measured with the DUT to give the device-only delay. This device-only delay is then reported.

DETAILED DESCRIPTION

Referring now to the drawing, a block diagram of the present invention, the operation of the present invention is disclosed.

System operation is controlled by a programmable microprocessor ("uP") 100, which may comprise a Zilog Z80 or other standard uP. The programmable uP determines a desired clock frequency and transmits that value to a programmable phase-locked loop 110, on control line 112. The phase-locked loop generates a raw clock signal of that frequency; the raw clock signal is input to a programmable divide-by-N counter 120, which is also controlled by the uP on control line 122. The divide-by-N counter in turn produces the actual system clock signal phi 124, which is returned to the uP as a processor clock.

The uP 100 determines a stimulus word to be presented to the DUT 160, and programs the pin multiplexors 150 accordingly, on control line 152. Each pin of the DUT may be individually programmed as either a "0", a "1", a pulsed input "0", a pulsed input "1", or as an output pin (described below). After the stimulus word and the DUT output pins have been selected, the uP will assert a read signal rho 104 which indicates that it is ready to time the DUT. The read signal rho is clocked through a clock latch 130, using the clock signal phi 124 as a clock. The output, at line 132, drives a 500 nsec (plus or minus 10%) fixed delay-line 140, producing a data bit 142. The data bit is inverted by invertor 144 and both it and its inverted form 146 are presented to the pin multiplexors 150. The pin multiplexors select the pre-programmed stimulus word and present it to the DUT pins 162.

When the stimulus word is presented to the DUT pins 162, the DUT 160 performs its normal operation and returns a response word on its output pins 164. Because the rise-time of the DUT response may be significant, the response word is presented to a set of comparators 170, which bitwise compare it against $v_{ref}$ 172, a programmable reference voltage which represents a digital "1" value. The comparator output on line 174, a digitized version of the DUT response word, is presented to the data latch 180.

To determine the delay introduced by the system's own components, an "auto-zero" procedure is carried out prior to device testing. In this procedure, the uP programs the pin multiplexors 150 to connect the stimulus word signals 142, 146 directly to the comparator inputs 164. This direct electrical connection will include all system delays, including those imposed by the pin multiplexor 150, except those of the DUT 160 itself and its wires 162, 163. The wire delay can be easily calculated using the known speed of electrical signals through copper and subtracted out. The system delay is then timed as if a DUT were present. Note that the 500 nsec delay is necessary for the auto-zero operation, because the uP would otherwise not be able to operate at the auto-zero clock rate. The delay-line need only be of moderate accuracy, but due to the self-calibrating nature of the circuit, short-term stability in the delay induced is strongly preferred.

The data latch 180 is enabled by the read signal rho 104 and clocked by the output of the clock latch 132. It is read on line 182 by the uP 100 after one cycle of the clock signal phi 124, so it contains the DUT's response 164 after just one cycle's worth of time. The uP will have determined an "expected response," based on its knowledge of the operation which the DUT performs, which it compares against the actual DUT response to see if the DUT 160 has completed its operation in the time allotted. For example, if the DUT is a programmable memory which has been previously loaded with a known set of values, the uP can expect the DUT to respond to a given stimulus (address) with the previously loaded value (data).

The timer process is repeated several times, starting with the maximum time value allowed by the DUT 160 specification, and with sequentially smaller time windows, until the DUT produces an incorrect (not expected) value. Because programmable oscillators can generally be adjusted to small frequency differences, a high degree of precision is allowed by this method of measurement. The uP 100 subtracts the system's own delay time to determine the delay due to the DUT operation. If the correct value is never produced, of course, an error is signalled to the operator to indicate that the DUT does not work at all.

Those skilled in the art will recognize that while a preferred embodiment has been disclosed, variations are possible without departing from the intended scope of the present invention.

I claim:

1. A system for measuring response time of a semiconductor device, comprising:
    (a) timing means for generating a first timing event, and for generating a second timing event a known delay after said first timing event;
    (b) input means synchronized with said first timing event, for injecting an input signal to the semiconductor device;
    (c) output means synchronized with said second timing event, for detecting an output signal from the semiconductor device; and
    (d) means for adjusting said known delay, responsive to said output signal from the semiconductor device.

2. A system for measuring response time of a semiconductor device, comprising:
    (a) adjustable clock means, for generating a periodic clock signal;
    (b) input means synchronized with said clock signal, for injecting an input signal to the semiconductor device; and
    (c) output means synchronized with said clock signal, for detecting an output signal from the semiconductor device after a known number of cycles of said clock signal;
    wherein said clock signal is repeatedly adjusted until the semiconductor device response time is equal to a known period of said clock signal.

3. A system as described in claim 2, wherein said adjustable clock means is controlled by a microprocessor under software control.

4. A system as described in claim 2, wherein said output means itself comprises:
    (a) register means, for storing the actual output of the semiconductor device at a known period of said clock signal; and
    (b) comparator means, for comparing the voltage amplitude of the semiconductor device output with an expected output level.

5. A system as described in claim 2, further comprising:
    autozero means, for measuring delay due to system components other than the semiconductor device.

6. A system as described in claim 5, wherein said autozero means comprises a direct electrical connection between said input and output means.

7. A system as described in claim 2, further comprising:
    delay means, for delaying said injection of an input signal to the semiconductor device for a known period of time.

8. A process for measuring response time of a semiconductor device, comprising the steps of:
    (a) generating an periodic clock signal;
    (b) injecting an input signal to the semiconductor device in synchrony with said clock signal;
    (c) detecting an output signal from the semiconductor device after a known period of said clock signal; and
    (d) adjusting the frequency of said clock signal repeatedly until the time taken by a known period of said timer signal just matches the time taken by the semiconductor device.

9. A process as described in claim 8, further comprising the step of:
    delaying said input signal
    before the step of injecting said input signal to the semiconductor device.

10. A process as described in claim 8, wherein the step of detecting an output signal from the semiconductor device itself comprises the steps of:
    (a) comparing the voltage amplitude output of the semiconductor device with an expected output level; and
    (b) storing the results of the comparison in an output register.

11. A process as described in claim 8, further comprising the step of:
   measuring the delay due to system components other than the semiconductor device.

12. A process as described in claim 8, further comprising the step of:
   delaying said injection of an input signal to the semiconductor device for a known period of time, so that total system speed is slow enough to allow automated microprocess control.

13. A system as described in claim 1, wherein said known delay is adjustable in increments of less than 200 picoseconds.

* * * * *